United States Patent [19]

Hill

[11] Patent Number: 5,177,558
[45] Date of Patent: Jan. 5, 1993

[54] WHEEL ALIGNMENT APPARATUS

[76] Inventor: Jerry M. Hill, 1420 Devens Dr., Brentwood, Tenn. 37027

[21] Appl. No.: 813,480

[22] Filed: Dec. 26, 1991

[51] Int. Cl.⁵ .......................................... G01B 11/275
[52] U.S. Cl. .................................... 356/152; 356/155; 33/288; 33/203.18
[58] Field of Search ............... 33/288, 203.18; 356/152, 155

[56] References Cited

U.S. PATENT DOCUMENTS

| | | | |
|---|---|---|---|
| Re. 33,144 | 1/1990 | Hunter et al. | 356/152 |
| 3,865,492 | 2/1975 | Butler | 356/155 |
| 4,095,902 | 6/1978 | Florer et al. | 356/155 |
| 4,097,157 | 6/1978 | Lill | 356/152 |
| 4,239,389 | 12/1980 | Hollandsworth et al. | 356/152 |
| 4,302,104 | 11/1981 | Hunter | 356/152 |
| 4,319,838 | 3/1982 | Grossman et al. | 356/152 |
| 4,341,021 | 7/1982 | Beissbarth | 33/203.18 |
| 4,341,468 | 7/1982 | Hollandsworth et al. | 356/155 |
| 4,383,370 | 5/1983 | Van Blerk et al. | 33/203.18 |
| 4,594,789 | 6/1986 | Marino et al. | 33/288 |

OTHER PUBLICATIONS

Hunter, Lee, "3-Lines", 1978.

Primary Examiner—Mark Hellner
Attorney, Agent, or Firm—Pitts & Brittian

[57] ABSTRACT

A wheel alignment apparatus (10) for measuring the toe angles of the wheels (42) of a vehicle such that the wheels (42) may be properly aligned, including vehicles whose rear axle (20) and front axle (22) are of unequal lengths. The wheel alignment apparatus (10) of the present invention includes at least one light beam source (14) for emitting a beam of light (24) toward a photosensor (12). The light beam (24) produces currents at each end of the photosensor (12), the currents then being measured and processed by a signal processor (16) to determine the impinging angle of the light beam (24). Each of the light beam sources (14) and the photosensors (12) are attached to the respective wheels (42) with connecting apparatuses, or heads (18). The photosensor (12) is a lateral photocell for receiving at least a portion of the emitted light beam (24) on a continuous active area (30). The signal processor (16) includes an Analog-to-Digital (A-D) converter (94) for data analysis and storage. Heads (18) are provided for carrying the light beam sources (14) and photosensors (12) and are placed about the vehicle proximate each wheel (42).

22 Claims, 5 Drawing Sheets

WHEEL ALIGNMENT APPARATUS

DESCRIPTION

1. Technical Field

This invention relates to the field of wheel alignment. More specifically the present invention relates to an apparatus for measuring the alignment angles and position of vehicle wheels for display and correction of at least the toe of the individual wheels.

2. Background Art

In the field of wheel alignment for motor vehicles, it is well known that the vehicle wheels must be aligned in a specified geometrical relationship for proper vehicle handling and minimum tire wear. Ideally, the following conditions exist for an aligned wheel system: each wheel is substantially perpendicular to its respective axle, therefore each wheel is substantially perpendicular to the ground and each pair of wheels attached at opposing ends of an axis are parallel; the front and rear axles are parallel to each other and perpendicular to the centerline of the vehicle; and a line bisecting the front and rear axles coincides with the center line of the vehicle.

Thus it can be seen that ideal alignment is destroyed if either axle is rotated away from perpendicular to the vehicle center line, if either wheel is rotated about its vertical axis away from a line parallel to the vehicle center line, or if either wheel is rotated away from the vertical position. Typical of the problems are wheel offset, toe, and camber. This device of the present application is directed toward the detection of toe angles and for the correction of the same, but it will be readily seen that the same principals may be applied to other alignment problems. The toe of a wheel is most easily defined as the angle between a predetermined longitudinal vehicle axis and a line of intersection between the wheel plane and the ground. The longitudinal axis and the axles between the front and rear pair of wheels in a real vehicle are not defined by real physical members with precise reference attachment points to make measurements from, therefore, the toe angles as defined above are not convenient to measure directly with optoelectronic sensors. This has resulted in a variety of schemes to define the longitudinal axis and the front and rear axles in terms of the relative angular relationships between adjacent wheels that are more convenient to measure using electronic angle sensors. The individual wheels are then adjusted to these effective axes for proper alignment.

It has become common practice to measure the wheel toe angles with respect to their adjacent wheels and use these measured angles to derive an effective geometric vehicle centerline or rear wheel thrust angle and then calculate the wheel toe angles with respect to the selected longitudinal vehicle axis.

Other devices have been produced to align vehicle wheels to correct toe, camber, and other common alignment problems. The devices disclosed in U.S. Pat. Nos. 4,341,021 issued to O. Beissbarth on Jul. 27, 1982 and 4,383,370 issued to V.B. Van Blerk, et al., on May 17, 1983 are two such devices which employ tensioning cables or springs around the wheels of the vehicle. The relative angles between the wheels are then measured by pickup signals received. In the Beissbarth device, the pickup signals are electrical signals whose magnitude and direction are determined by the angular relationship of the subject wheels. Similarly, the Van Blerk, et al. device provides an angular reading directly from mechanical gauges attached at the respective ends of the tensioning device.

Several devices have been designed to incorporate reflective elements such that a light signal may be emitted from a first housing, reflected back by the reflective element, and received by the first housing for analysis. Typical of this type of alignment apparatus are those devices disclosed in U.S. Pat. Nos. 4,095,902 issued to R. H. Florer, et al., on Jun. 20, 1978; 4,097,157 issued to M. H. Lill on Jun. 27, 1978; 4,239,389 issued to W. J. Hollandsworth, et al., on Dec. 16, 1980; and 4,341,468 issued to W. J. Hollandsworth, et al., on Jul. 27, 1982.

Still other types of devices have been used to align the wheels of a vehicle, wherein light sensors are used to detect a beam of light directly from a light source. Typical of this type of device are those disclosed in U.S. Pat. Nos. 3,865,492 issued to L. L. Butler on Feb. 11, 1975; 4,302,104 issued to L. Hunter on Nov. 24, 1981 and reissued on Jan. 9, 1990 as Re. 33,144; 4,319,838 issued to J. M. Grossman, et al., on Mar. 16, 1982; and 4,594,789 issued to J. A. Marino, et al., on Jun. 17, 1986. The devices such as those disclosed by Hunter and Grossman, et al., typically employ a pair of photosensors with active areas spaced apart to detect portions of a light beam directed to contact the sensors directly and simultaneously. Other devices, such as the Marino, et al. device use a photosensor matrix such that the center of an impinging beam is determined from a pixel-by-pixel analysis, the analysis sensing each pixel in the path of the beam.

In the devices disclosed by Hunter and Grossman, et al., the analysis of the impinging angle of the beam of light is determined by the proportional amount of current flowing through each sensor, the current being generated by the incident light. As Marino, et al., discloses, the angular data may also be calculated from data including the location of the pixel determined to be in the center of the impinging beam in relation to the center of the photosensor matrix.

The devices incorporating photosensors to calculate the relative angles between wheels are most appropriately associated with the device of the present invention. However, none of these discloses an apparatus or system for detecting the relative wheel angles using a simple circuit which includes a continuous photosensor. The use of two photosensors is effective only when the projected beam is incident to both photosensors. If the beam is oriented such that only one of the photosensors is within the path of the beam, then the angle data will be inaccurate.

It is desired to accomplish the task of accurately measuring the relative wheel angles using photosensors that will enable the measurements to be made with only a small spot of light and with the light impinging at any angle and on any portion of the photosensor. It is desired that a system may be designed such that the signal may strike the photosensor even at a small portion of one end and an accurate reading be recorded thus providing the capability of measuring larger wheel angles.

Therefore, it is an object of this invention to provide a means for measuring the relative angles between the wheels of a vehicle for alignment purposes.

Another object of the present invention is to provide a means for accurately measuring the relative angles between the wheels of a vehicle using a continuous photosensitive element designed to produce the accurate measurement from impinging light rays at any point on the photosensor.

Still another object of the present invention is to provide a means whereby a plurality of photosensors are incorporated with a plurality of light beams, the photosensors being placed about the vehicle such that the alignment process may be accomplished in a quicker and easier fashion.

DISCLOSURE OF THE INVENTION

Other objects and advantages will be accomplished by the present invention which serves to measure the toe angles of the wheels of a vehicle such that the wheels may be properly aligned. Moreover, in the preferred embodiment the wheel alignment apparatus is designed to detect the toe angles of the wheels of a vehicle whose rear axle and front axle are of unequal lengths.

The wheel alignment apparatus of the present invention includes at least one angle sensing means for measuring the relative angles of two wheels of a vehicle. Each angle sensing means includes a light beam source for emitting a beam of light in a direction substantially parallel to a line passing through the center of the subject wheels. Further, the angle sensing means includes a light beam sensing means positioned to receive at least a portion of the emitted light beam. The light beam produces currents at each end of the light beam sensing means, the currents then being measured and processed by a processing means to determine the impinging angle of the light beam and therefore the relative angle of the light beam to the line passing through the center of the subject wheels. Each of the light beam sources and the light beam sensing means are attached to the respective wheels with connecting apparatuses, or heads.

The light beam sensing means of the preferred embodiment is a lateral photocell provided for receiving at least a portion of the emitted light beam. In the preferred embodiment, a photosensor with a continuous active area is provided. As the light beam impinges the sensing means, electrons on the surface of the sensing means are excited and thus flow linearly in either direction, thus producing currents at either end of the sensing means. The sensing means is provided with a plurality of contacts for sending generated currents to the processing means. Due to the linearity of the currents, the location of the center of the beam on the surface of the sensing means can be detected.

The active area of the sensing means is continuous, thereby allowing for an accurate measurement for any impinging beam, at least a portion of which is striking the active area. It will be seen that an accurate measurement may be taken even if the entire beam is impinging on one side of the center contact.

The light beam sensing means includes a limiting means, or stop, for regulating the size of the impinging beam. The stop includes a membrane positioned substantially parallel to the active area of the sensing means. The membrane defines an aperture through which at least a portion of the emitted light beam may pass.

A light beam source is provided for emitting a beam of light generally in the direction of the light beam sensing means. The light beam source of the preferred embodiment is an LED placed on one side of a lens. The lens has a selected focal point with a side opposite the LED light source which has a convex configuration. At least one baffle is provided on one side of the lens opposite the LED light source. Each baffle defines an opening through which at least a portion of a beam of light passes, the beam of light being directed toward the light beam sensing means.

The electronic circuitry of the preferred embodiment includes the photosensors as described and output leads for conveying the generated currents to pre-amplifiers. A preamplifier is provided for each current generated, each pre-amplifier having substantially identical characteristics. The amplified signals are then conveyed to a primary amplifier. A multiplexer is provided at the input of the primary amplifier for processing a plurality of signals, the multiplexer switching between the signals as each is being processed. The signals are then passed through a band pass filter, a programmable gain amplifier, and into an amplitude detector. The amplitude detector is designed to remove the modulated drive frequency of the modulated LED light source. With the bandpass filter tuned to the modulated frequency of the LED light source, all ambient light beams are removed from the measurements, thereby insuring accurate calculations. The detector of the preferred embodiment includes a precision detector in series with a low pass filter.

The output of the detector passes through a direct current amplifier to a second multiplexer. The second multiplexer serves to measure the vertical angles of the measuring devices. The vertical angles are introduced into the electronic circuitry through camber sensors and steering axis inclination (SAI) sensors. The signals processed by the second multiplexer are delivered to an Analog-to-Digital (A-D) converter. At this point, the signal of interest has been processed and is available in the system in the digital domain. The digitized signals are passed to a processing means for data storage and acquisition, and then are passed on to a serial link to be delivered to a computer external to the apparatus.

Measurements taken from the camber and SAI sensors are first processed through a first amplifier means, and then a second amplifier means before being communicated to the second multiplexer. The sensors used for obtaining the camber and SAI signals produce signals that are similar to the signals from the photosensors of the light beam sensing means.

A power supply is provided to drive the system. The power supply may be any conventional means such as a typical alternating current source. An LED drive is provided for modulating the LED signals emitted for detection by the signal sensing means. Further, the system includes an encoder signal, the encoder signal being used for determining the respective wheel rotational angles.

A keyboard interface is included for the manual programming of the apparatus. The keyboard interface may be of any type as required by the particular user of the equipment.

Head members used for carrying the light beam emitters and sensing means are placed about the vehicle proximate each wheel. Typically, a primary head is fixed to each of the steering wheels and a secondary head is fixed to each of the non-steering wheels. In the event the vehicle has four steering wheels, a primary head is fixed to each of the primary steering wheels and a secondary head is fixed to each of the secondary steering wheels. The heads are attached to the respective wheels in a conventional manner such that the emitted light beams directed substantially parallel to the centerline of the vehicle are further directed substantially parallel to the wheel to which the light source is attached. Further, the primary heads are attached to the steering wheels such that each light beam directed across the vehicle is directed substantially perpendicular to the wheel to which the light source is attached.

Each head is equipped with at least one light beam emitter for determination of the local angle with respect to an adjacent wheel. Further carried by each head is at least one light beam sensing means designed to intercept at least a portion of a beam emitted from a head fixed to a wheel adjacent to the subject wheel. Extensions are provided on the primary heads for the location of respective light beam emitters and sensors used to measure the relative angles between the front two wheels. In the preferred embodiment, at least six light beam sources are provided, one directing a beam of light in either direction on either side of the vehicle and one directing a beam of light in either direction across the front of the vehicle. A light beam sensing means is provided for each of the light beam sources and is carried by opposing heads.

BRIEF DESCRIPTION OF THE DRAWINGS

The above mentioned features of the invention will become more clearly understood from the following detailed description of the invention read together with the drawings in which:

FIG. 2 illustrates an elevation view of the light source of the present invention, the plan view being similar.

BEST MODE FOR CARRYING OUT THE INVENTION

Figure 1:
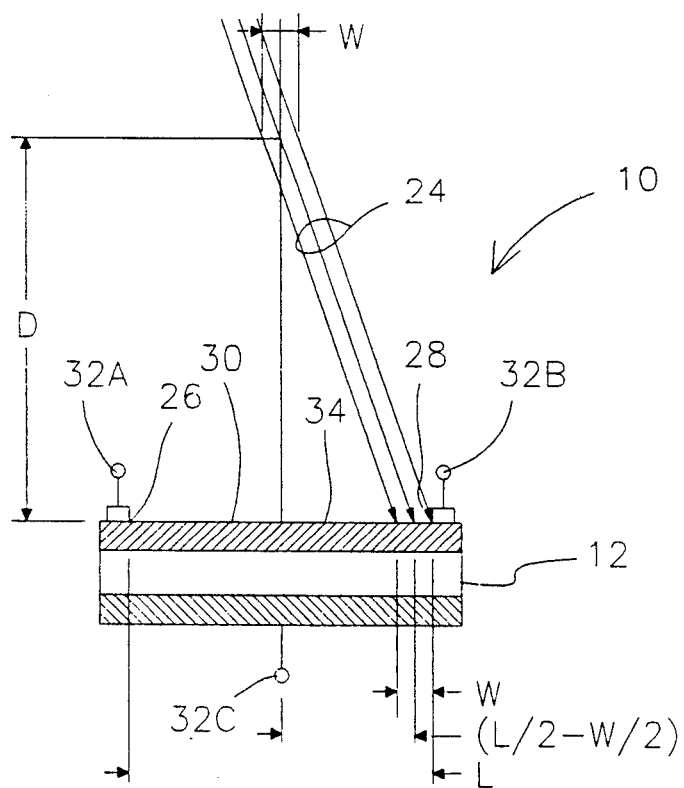
FIG. 1 is a schematic diagram of a plan view of the photosensing means of the wheel alignment apparatus constructed in accordance with several features of the present invention showing an impinging beam striking one end of the active area.

A wheel alignment apparatus incorporating various features of the present invention is illustrated generally at 10 in the figures. The wheel alignment apparatus 10 is designed for measuring the toe angles of the wheels 42A, 42B, 42C, 42D of a vehicle such that the wheels 42A, 42B, 42C, 42D may be properly aligned. Moreover, in the preferred embodiment the wheel alignment apparatus 10 is designed to detect the toe angles of the wheels 42A, 42B, 42C, 42D of a vehicle whose rear axle 20 and front axle 22 are of unequal lengths.

The wheel alignment apparatus 10 includes at least one angle sensing means for measuring the relative angles of two selected wheels 42 of a vehicle. Each angle sensing means includes a light beam source 14 for emitting a beam of light 24 in a direction substantially parallel to a line passing through the center of the subject wheels 42. Further, the angle sensing means includes a light beam sensing means 12 positioned to receive at least a portion of the emitted light beam 24. The light beam 24 produces currents at each end 26, 28 of the light beam sensing means 12, the currents then being measured and processed by a processing means 16 to determine the impinging angle of the light beam 24 and therefore the relative angle of the light beam 24 to the line passing through the center of the subject wheels 42. Each of the light beam sources 14 and the light beam sensing means 12 are attached to the respective wheels 42A, 42B, 42C, 42D with connecting apparatuses, or heads 18, the heads 18 being typically known in the art. Each of the elements of the present invention will be further described in the detailed description of the drawings to follow.

Referring to FIG. 1, which is a schematic diagram of a light beam sensing means 12, a lateral photocell is provided for receiving at least a portion of the emitted light beam 24. In the preferred embodiment, a photosensor 12 with a continuous active area 30 is provided. As the light beam 24 impinges the sensing means 12, electrons on the surface of the sensing means 12 are excited and thus flow linearly in either direction, thus producing currents at either end 26, 28 of the sensing means 12. The sensing means 12 is provided with a plurality of contacts, or output leads 32, for sending generated currents to the processing means 16.

As shown in FIG. 1, three contacts 32 are provided in the preferred embodiment. Included are a first end contact 32A, a second end contact 32B, and a center contact 32C. Each of the contacts 32 are located on the photosensor 12 proximate the surface 34 such as to receive the current generated by the impinging light beam 24. Due to the linearity of the currents, the location of the center of the beam 24 on the surface of the sensing means 12 can be detected. The magnitudes of the respective currents are dependent on the resistance of their paths, therefore, the shorter path will have a smaller resistance, and thus a greater current generated. Therefore, the distance from the center of the sensing means 12 can be determined as a function of the proportionality of the respective end currents generated. The center contact 320 of the preferred embodiment is grounded as shown.

As described, the active area 30 of the sensing means 12 is continuous. The continuity of the active area 30 allows for an accurate measurement for any impinging beam 24, at least a portion of which is striking the active area 30. It will be seen that an accurate measurement may be taken even if the entire beam 24 is impinging on one side of the center contact. The sensing means 12 of the preferred embodiment is a photosensor, or position sensor, and may include position sensors such as those produced by Silicon Detector Corporation, 1240 Avenida Acasca, Camarillo, Calif., 93020, and more specifically, the position sensor may be one similar to Silicon Detector Corporation Number SD-386-22-21-251.

The light beam sensing means 12 includes a limiting means, or stop 36, for regulating the size of the impinging beam 24. The stop 36 is a membrane positioned substantially parallel to the active area of the sensing means 12. The membrane 36 defines an opening 38 through which at least a portion of the emitted light beam 24 may pass. The dimensions of the stop opening 38 are selectable for a selected range of sensing angles. As the width of the opening 38 is reduced, the effective range of the sensing means 12 is increased. The distance between the stop 36 and the active area 30 also controls the effective range of the sensing means 12. As the distance increases, the effective range of angles decreases.

As depicted in FIG. 1. the effective angular range can be determined by the following:

$$Angular\ Range = -TAN^{-1}(L/2 - W/2)/D$$

where:
L = the active area 30 length between the end contacts 32A, 32B;
W = the Width of the stop opening 38, and thus the width of the impinging beam 24; and
D = the distance between the stop 36 and the active area 30.

Thus the term (L/2 − W/2) represents the distance from the center of the active area 30 to the center of the impinging beam 24.

Other advantages of the continuous active area 30 of the sensing means 12 of the present invention is regularity of the active area 30 to the outer limits of the active area 30. Any irregularities cause similar irregularities in measurements taken, thus continuity over the entire surface of the active area minimizes the inaccuracies of the measurements.

Figure 2:
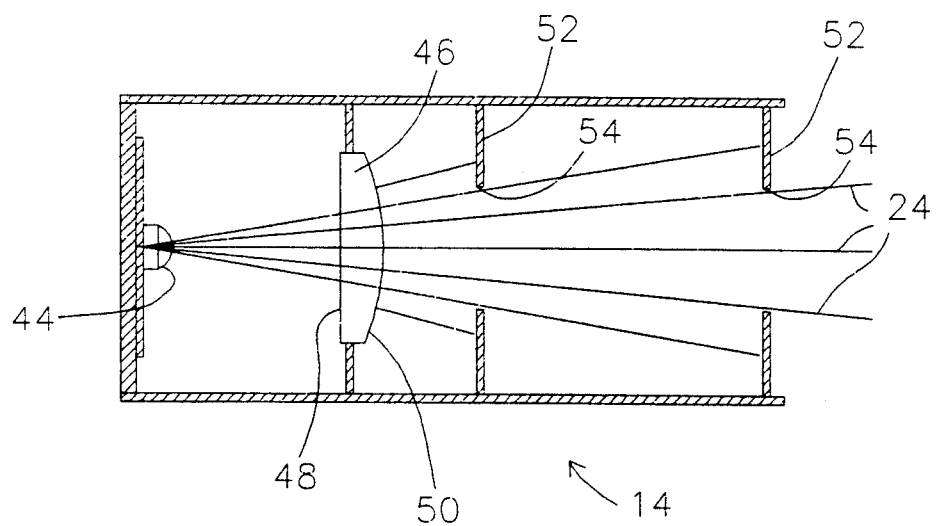

Referring now to FIG. 2, a light beam source 14 is provided for emitting a beam of light 24 generally in the direction of the light beam sensing means 12. The light beam source 14 of the preferred embodiment comprises an LED 44 placed on one side 48 of a lens 46. The lens 46 has a selected focal point with a side 50 opposite the LED light source 44, the second side 50 having a convex configuration. At least one baffle 52 is provided on the second side 50 of the lens 46 opposite the LED light source 44. Each baffle 52 defines an opening 54 through which at least a portion of a beam of light 24 passes, the beam of light 24 being directed toward the light beam sensing means 12. The angular range of the LED light source 14 may be determined in a similar fashion as above, the angular range being a function of the opening 54 dimensions of the baffle 52 farthest from the light source 14 and the distance from the focal point of the lens 46 and the baffle 54 farthest from the light source 14.

Figure 3:
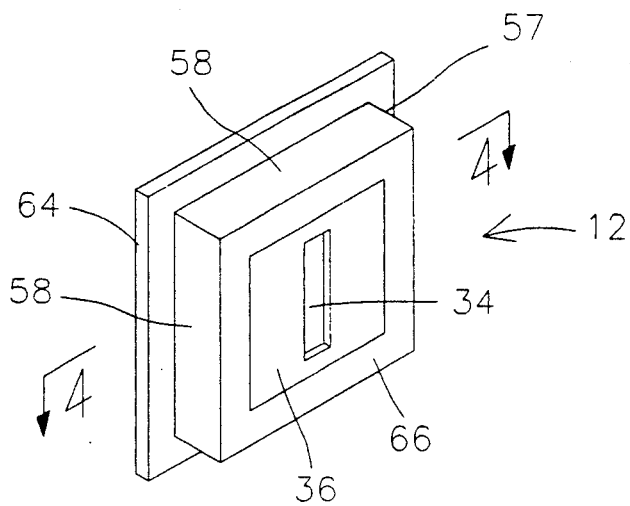
FIG. 3 is a perspective view of the signal sensing means of the present invention.

FIG. 3 illustrates a perspective view of the light beam detecting means 12 used in the preferred embodiment. A housing 56 is provided for mounting the photosensor 12 to the apparatus 10. The housing 56 includes at least a mounting plate 64 dimensioned to carry the photosensor 12, and a stop support 57 on which is mounted the stop membrane 36. In the preferred embodiment, side walls 58 are provided to prevent ambient light sources from interfering. In this embodiment, the side walls 58 are continuous to form a substantially rectangular opening 60. The opening 60 is dimensioned to receive the photosensor 12. The stop membrane 36 is fixed to the housing 56 proximate the opening 60. In the preferred embodiment, the stop membrane 36 is dimensioned to substantially cover the opening 60. An aperture 38 is defined by the stop membrane 36 as described above.

The aperture 36 is dimensioned for the passage of the light beam 24 directed from the light beam source 14.

Figure 4:
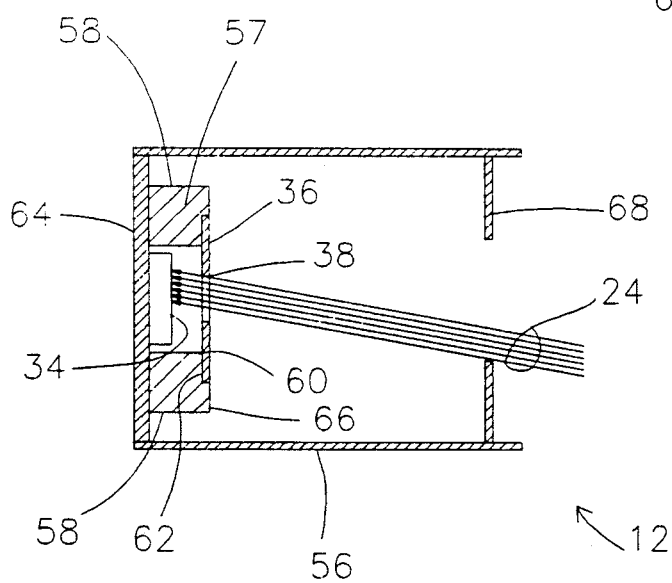
FIG. 4 illustrates a plan view, in section, of the signal sensing means of the present invention taken an 4—4 of FIG. 3.

Referring now to FIG. 4, a top plan view, in partial cross-section, of the light beam sensing means 12 is shown. The side walls 58 are shown to define a recessed portion 62 about the top edge 66. The recessed portion 62 is defined to closely receive the stop membrane 36. As shown in this figure, at least one baffle 68 may be provided for further limiting the angular range of the light beam sensing means 12. The baffle 68 may be dimensioned to prevent light beams 24 from passing through the aperture 38 of the stop membrane 36 in such instances where any portion of the beam 24 would impinge an inactive portion of the sensing means 12. Thus, with such a baffle 68, any beam of light 24 reaching the active area 30 will produce an accurate measurement of the relative angle between the subject wheels 42.

Figure 5:
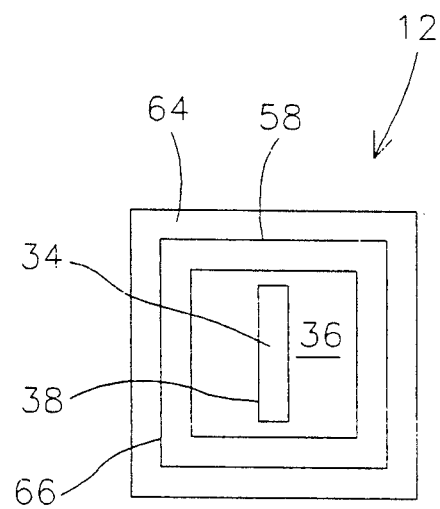
FIG. 5 illustrate a front elevation view of the signal sensing means of the present invention.

FIG. 5 illustrates a front elevation view of the light beam sensing means 12 of the preferred embodiment. This view illustrates the area of the photosensor 12 which is stricken by a beam of light 24 in the situation where the subject wheels 42 are properly aligned with respect to one another. In this figure, the measured angles will be zero. As the wheels 42 are moved away from alignment, the view of the photosensor 12 will move to the left or right, the angle which will be measured as a function of the relative magnitudes of the currents generated at the opposite ends 26, 28 of the photosensor 12.

Figure 6:
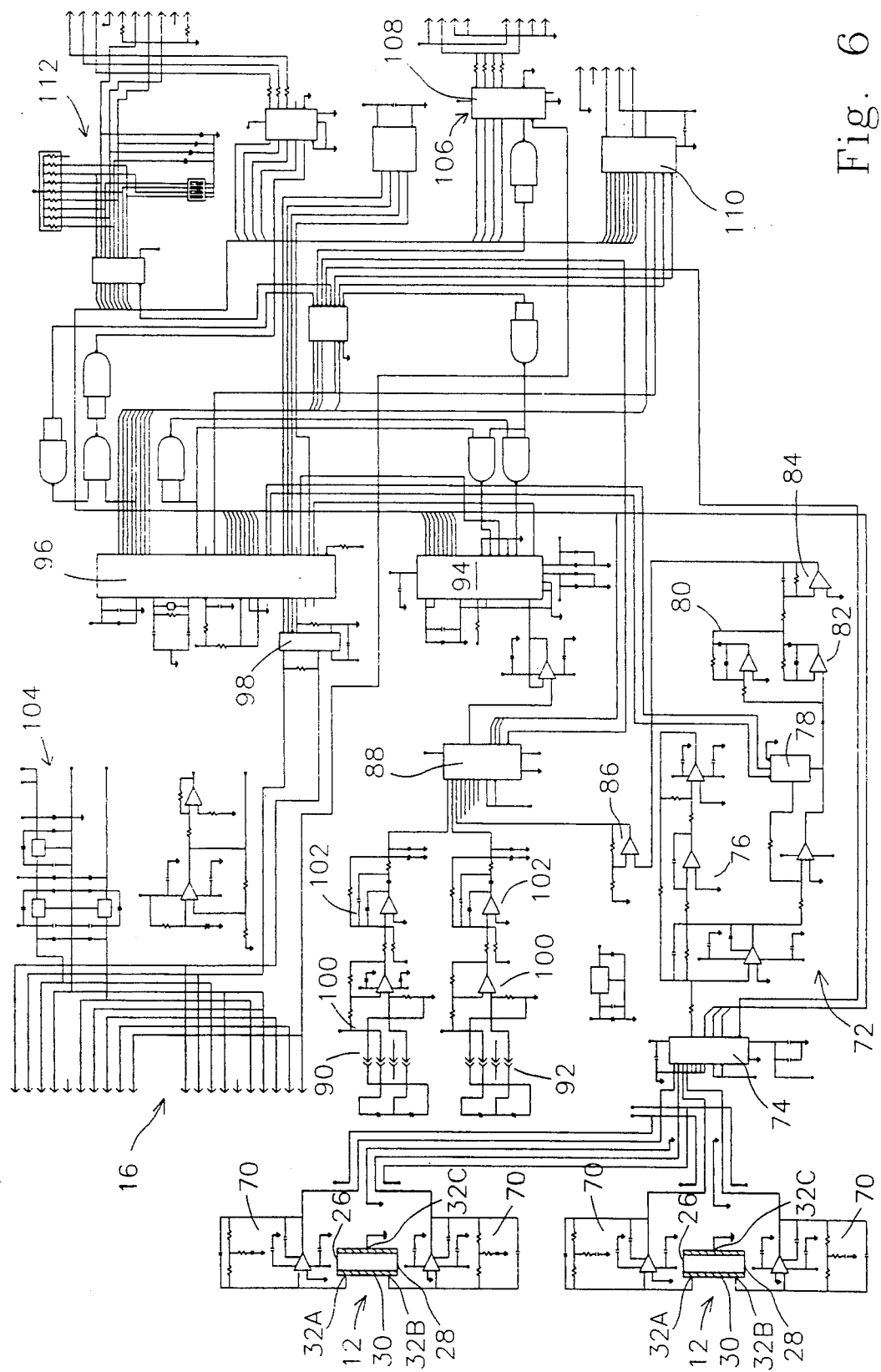
FIG. 6 is a schematic diagram of the electrical circuitry of the present invention.

Referring now to FIG. 6, a schematic representation of the electronic circuitry of the preferred embodiment is shown. The photosensor 12 includes output leads 32 for conveying the generated currents to pre-amplifiers. A pre-amplifier 70 is provided for each current generated, each pre-amplifier 70 having substantially identical characteristics.

The amplified signals are then conveyed to a primary amplifier 72. A multiplexer 74 is provided at the input of the primary amplifier 72 for processing a plurality of signals, the multiplexer 74 switching between the signals as each is being processed. In the preferred embodiment, the multiplexer 74 is designed to process two signals each from two light beam sensors 12, thus allowing for the simultaneous calculation of angles measured by a plurality of photosensors 12.

The signals are then passed through a bandpass filter 76, a programmable gain amplifier 78, and into an amplitude detector 80. The amplitude detector 80 is designed to remove the modulated drive frequency of the modulated LED light source 14. With the bandpass filter 76 tuned to the modulated frequency of the LED light source 14, all ambient light beams are removed from the measurements, thereby insuring accurate calculations. The amplitude detector 80 of the preferred embodiment includes a precision detector 82 in series with a low pass filter 84.

The output of the amplitude detector 80 passes through a direct current amplifier 86 to a second multiplexer 88. The second multiplexer 88 serves to measure the vertical angles of the measuring devices 10. The vertical angles are introduced into the electronic circuitry through camber sensors 90 and steering axis inclination (SAI) sensors 92.

The signals processed by the second multiplexer 88 are delivered to an Analog-to-Digital (A-D) converter 94. At this point, the signal of interest has been processed and is available in the system in the digital domain. The digitized signals are passed to a processing means 96 for data storage and acquisition, and then are passed on to a serial link 98, such as an RS485 serial link. The information is then delivered to a computer (not shown) external to the apparatus. It is understood, however, that the computer portion of the invention may be incorporated within the embodiment of the electrical circuitry. Thus, the process may be repeated for each signal of interest, starting again at the first multiplexer 74 and continuing until each signal received by the first multiplexer 74 has been converted to the digital domain.

Measurements taken from the camber and SAI sensors 90, 92 are first processed through a first amplifier means 100, and then a second amplifier means 102 before being communicated to the second multiplexer 88. The sensors 90, 92 used for obtaining the camber and SAI signals are similar to the photosensors of the light beam sensing means 12, each being a variable capacitive device.

A power supply 104 is provided to drive the wheel alignment apparatus 10. The power supply 104 may be any conventional means such as a typical alternating current source. An LED drive 106 is provided for modulating the LED signals 24 emitted for detection by the signal sensing means 12.

A keyboard interface is included at 112 in the figure for the manual programming of the apparatus 10. The keyboard interface 112 is carried by the head member 18. The keyboard interface 112 may be of any type as required by the particular user of the equipment.

Figure 7:
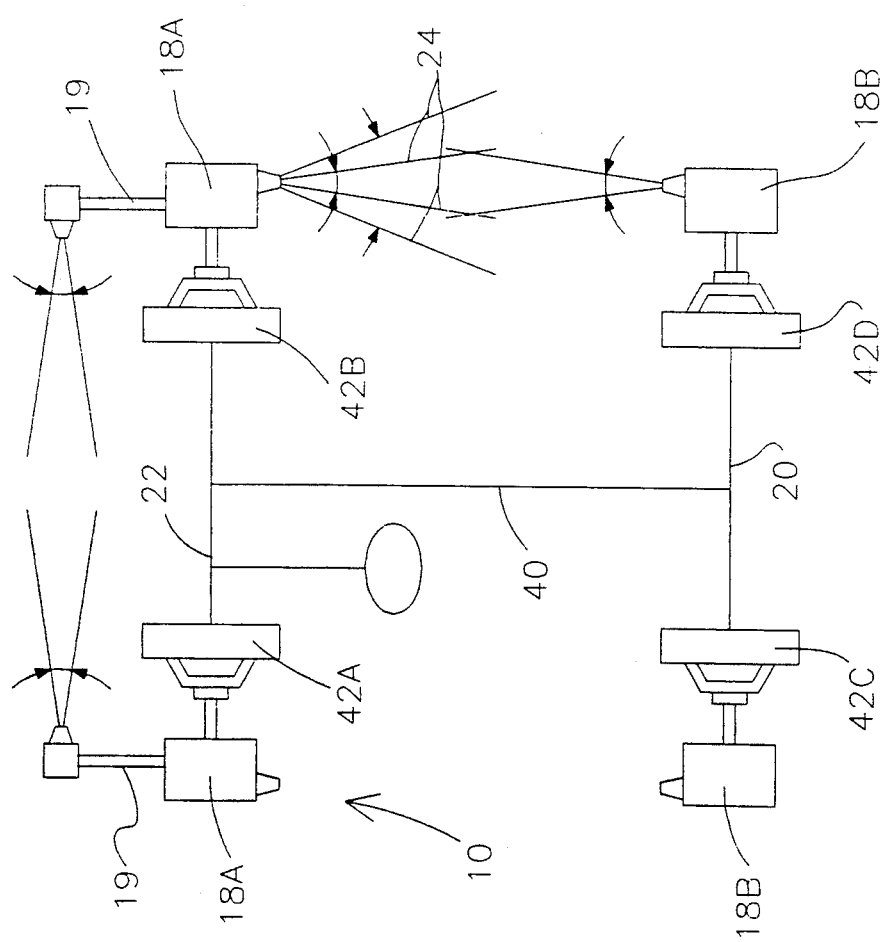
FIG. 7 is a schematic diagram of a plan view of the present invention showing the light source beam ranges and sensor ranges of a plurality of light sources and cooperating detectors located in the preferred positions about the wheels of a vehicle.

The illustration of FIG. 7 is a schematic diagram showing the wheels 42 of a four-wheel vehicle, the wheels 42 being in a substantially rectangular spaced apart orientation.

FIG. 7 further illustrates the placement of the head members 18 used for carrying the light beam sources 14 and sensing means 12. As shown, heads 18 are fixed to the wheels 42 at locations about the vehicle. Typically, a primary head 18A is fixed to each of the steering wheels 42A, 42B and a secondary head 18B is fixed to each of the non-steering wheels 42C, 42D. In the event the Vehicle has four steering Wheels (not shown), a primary head 18A is fixed to each of the primary steering wheels 42A, 42B and a secondary head 18B is fixed to each of the secondary steering wheels (not shown). The heads 18 are attached to the respective wheels 42 in a conventional manner such that the emitted light beams 24 directed substantially parallel to the centerline 40 of the vehicle are further directed substantially parallel to the wheel 42 to which the light source 14 is attached. Further, the primary heads 18A are attached to the steering wheels 42A, 42B such that each light beam 24 directed across the vehicle is directed substantially parallel to the centerline of the wheel 42A, 42B to which the light source 14 is attached.

Each head 18 is equipped with a plurality of light beam emitters 14 for determination of the local angle with respect to an adjacent wheel 42. Further carried by each head 18 is a plurality of light beam sensing means 12 designed to intercept at least a portion of a beam 24 emitted from a head 18 fixed to a wheel 42 adjacent to the subject wheel 42. Extension arms 19 are provided on the primary heads 18A for the location of respective light beam emitters 14 and sensors 12 used to measure the relative angles between the front two wheels 42A, 42B. In the preferred embodiment, at least six light beam sources 14 are provided, one directing a beam of light 24 in either direction on either side of the vehicle and one directing a beam of light 24 in either direction across the front of the vehicle. A light beam sensing means 12 is provided for each of the light beam sources 14 and is carried by opposing heads 18.

Figure 8:
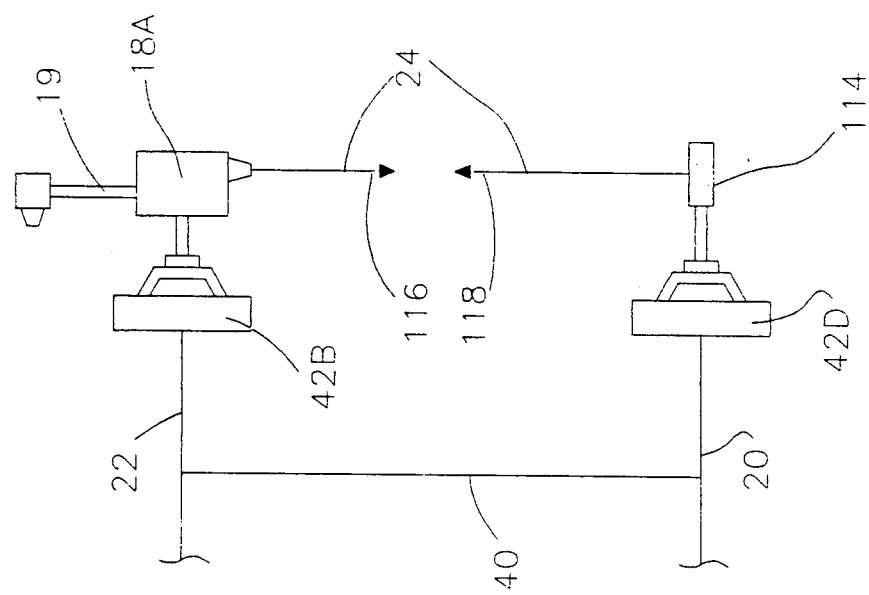
FIG. 8 is a schematic diagram of a plan view of the present invention showing an alternate embodiment of the light beam sensor, wherein reflective surfaces are employed.

In an alternate embodiment shown in FIG. 8, a head 18 is mounted to wheel 42B and a reflective surface 114 is mounted to the wheel 42D. As described above, the head 18 includes at least one light beam sensing means 12 and at least one light beam source 14. In this embodiment, the relationship between the light beam sensing means 12, the light beam source 14 and the reflective surface 114 is such that as the light beam source 14 emits a light beam 24 toward the wheel 42D as depicted by arrow 116, at least a portion of the light beam 24 contacts the reflective surface 114. That portion of the light beam 24 which contacts the reflective surface 114 is reflected back toward the wheel 42B as depicted by arrow 118 and at least a portion of the reflected light beam 24 contacts the light beam sensing means 12. It will be understood that though FIG. 8 depicts the arrangement as described, the light beam source 14, the light beam sensing means 12, and the reflective surface 114 may be mounted in like fashion on any two adjacent wheels 42.

Figure 9:
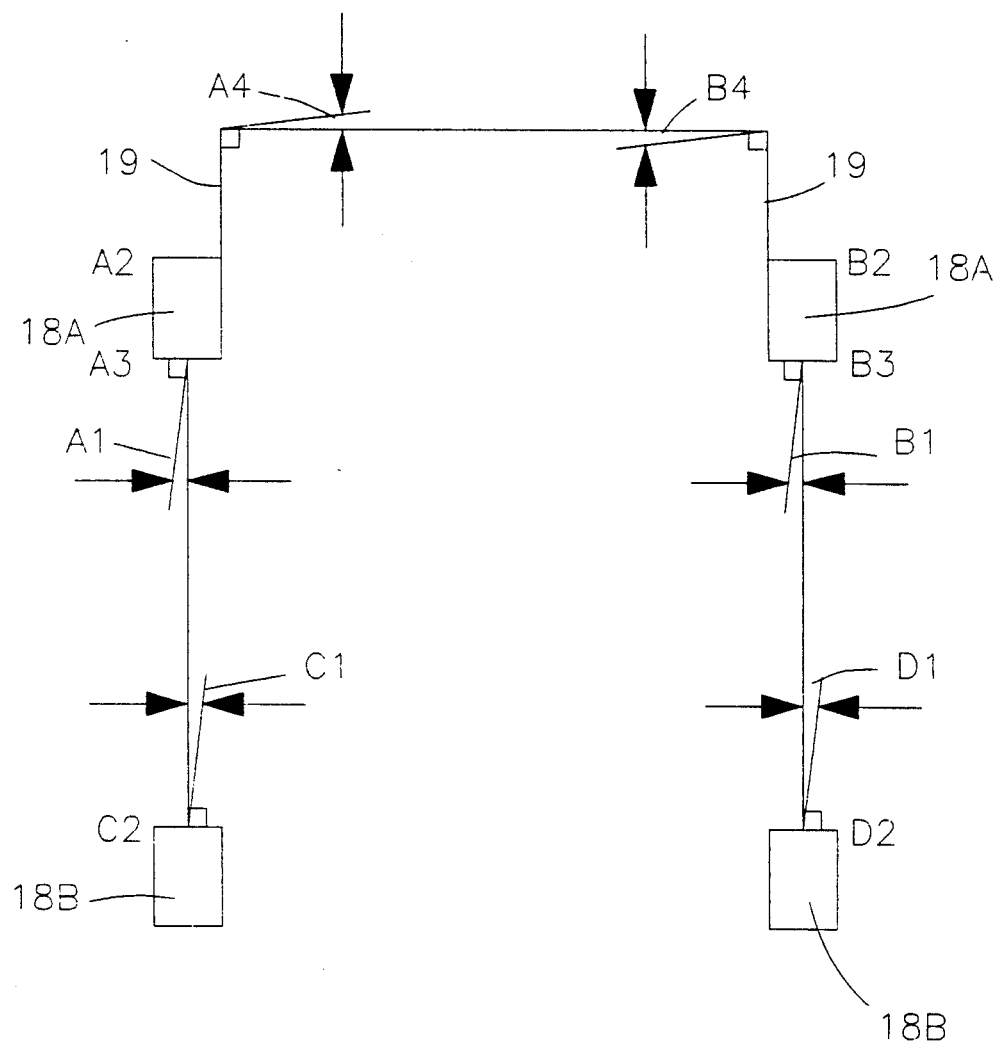
FIG. 9 is a schematic diagram showing the angles measured by the wheel alignment apparatus of the present invention in the preferred embodiment.

Now referring to FIG. 9, a schematic diagram is shown referencing all appropriate angles to be measured by the apparatus 10. It will be seen from this schematic diagram when viewed in light of Table 1 below that the calculations are typically standard. However, it should be noted that the toe of each of the rear wheels 42C, 42D is taken into account when measuring the toe angles of the front wheels 42A, 42B. It is this consideration which allows the toe of a set of wheels 42C, 42D mounted in tandem on an axle to be measured without the removal of the outer tires. The measured angles are denoted by a letter followed by a number. The letter A denotes the primary head 18A located on the left front wheel 42A, and letter B denotes the primary head 18A located on the right front wheel 42B. The letters C and D represent the secondary heads 18 located on the left and right rear wheels 42C, 42D, respectively. The numbers 1-4 represent the respective angles measured.

From the foregoing description, it will be recognized by those skilled in the art that a wheel alignment apparatus offering advantages over the prior art has been provided. Specifically, the wheel alignment apparatus provides a means for measuring the toe angles of the wheels of a vehicle such that they may be properly aligned. Moreover, in the preferred embodiment the wheel alignment apparatus is designed to detect the toe angles of the wheels of a vehicle whose rear axle and front axle are of unequal lengths.

While a preferred embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention,
1. A wheel alignment apparatus for measuring selected angles between adjacent wheels of a vehicle, said wheel alignment apparatus comprising:
  a light beam source for emitting a plurality of light beams, each of said light beams emitted from a position proximate a first selected wheel of said vehicle toward an adjacent second selected wheel, said light beam source comprising at least one light emitting diode for emitting a light beam modulated at a selected frequency, said modulated light beam being directed in a substantially horizontal plane and in a direction substantially parallel to a selected axis of said first selected wheel;

a light beam sensor for detecting said light beam modulated at said selected frequency, said light beam sensor generating at least two signals, one of said signals being detected at each of first and second ends of said light beam sensor, a magnitude of each of said signals being used to determined a relative angle between a selected axis of said first selected wheel and a corresponding axis of said adjacent second selected wheel, said light beam sensor including a position sensitive photosensor defining an active area positioned to receive said light beam, said active area being continuous between said first and second ends of said light beam sensor;

a signal processor for processing and analyzing said generated signals for said determination of said relative angle between said selected axis of said first selected wheel and said corresponding axis of said adjacent second selected wheel;

a wheel attachment device for attaching said light beam source to said first selected wheel; and a wheel attachment device for attaching said light beam sensor to a selected wheel of said vehicle.

2. The wheel alignment apparatus of claim 1 wherein said signal processor includes a device for converting said processed signal from an analog domain to a digital domain.

3. The wheel alignment apparatus of claim 1 wherein said position sensitive photosensor is positioned proximate said adjacent second selected wheel of said vehicle such as to detect a portion of said light beam emitted from said light beam source and modulated at said selected frequency.

4. The wheel alignment apparatus of claim 1 wherein said light beam sensor further includes a light beam reflector positioned proximate said adjacent second selected wheel of said vehicle for reflecting at least a portion of said light beam emitted from said light beam source in a direction substantially toward said position sensitive photosensor, said position sensitive photosensor being positioned proximate said first selected wheel of said vehicle such as to detect at least a portion of said light beam reflected from said light beam reflector, said light beam being modulated at said selected frequency.

5. The wheel alignment apparatus of claim 1 being further designed for measuring said selected angles between said selected axis of said first selected wheel and said corresponding axis of said adjacent second selected wheel, said first selected wheel being attached to a steering axle of said vehicle and said adjacent second selected wheel being attached to a non-steering axle of said vehicle.

6. The wheel alignment apparatus of claim 1 being further designed for measuring said selected angles between said selected axis of said first selected wheel and said corresponding axis of said adjacent second selected wheel, said first selected wheel being attached to a primary steering axle of said vehicle and said adjacent second selected wheel being attached to a secondary steering axle of said vehicle.

7. The wheel alignment apparatus of claim 1 wherein at least six said light beam sources are located proximate said vehicle wheels, one each located proximate each said wheel attached to a steering axle directed toward adjacent wheels attached to a non-steering axle, one each located proximate each of said wheels attached to said non-steering axle directed toward adjacent said wheels attached to said steering axle, and one each located proximate each of said wheels attached to said steering axle directed toward adjacent said wheels attached to said steering axle.

8. The wheel alignment apparatus of claim 7 wherein at least six said light beam sensors are located proximate said vehicle wheels, each of said light beam sensors being positioned to detect said light beam emitted from one said light beam sources.

9. The wheel alignment apparatus of claim 1 wherein said magnitude of one of said signals generated by said light beam sensor and detected at said first and second ends of said light beam sensor is zero.

10. The wheel alignment apparatus of claim 1 further comprising a light beam limiting device for limiting a width of said light beam detected by said light beam sensor such that substantially all of said light beam passing through said light beam limiting device is detected by said light beam sensor.

11. A wheel alignment apparatus for measuring selected angles between adjacent wheels of a vehicle, said wheel alignment apparatus comprising:

a plurality of light beam sources for emitting a plurality of light beams, each of sadi light beams emitted from a position proximate a first selected wheel of said vehicle toward an adjacent second selected wheel, said light beam source comprising at least one light emitting diode for emitting a light beam modulated at a selected frequency, said modulated light beam being directed in a substantially horizontal plane and in a direction substantially parallel to a selected axis of said first selected wheel, one of said plurality of light beam sources being located proximate each of said wheels attached to a steering axle directed toward adjacent wheels attached to a non-steering axle, one each located proximate each of said wheels attached to said non-steering axle directed toward adjacent said wheels attached to said steering axle, and one each located proximate each of said wheels attached to said steering axle directed toward adjacent sadi wheels attached to said steering axle;

a plurality of light beam sensors for detecting said light beam modulated at said selected frequency, each of said plurality light beam sensors generating at least two signals, one of said signals being detected at each of first and second ends of each of said plurality of light beam sensors, a magnitude of each of said signals being used to determine a relative angle between a selected axis of said first selected wheel and a corresponding axis of said adjacent second selected wheel, said light beam sensor including a position sensitive photosensor defining an active area positioned to receive said light beam, said active area being continuous between said first and second ends of said light beam sensor, each of said plurality of light beam sensors being positioned to detect said light beam emitted from one said light beam sources;

a signal processor for processing and analyzing said generated signals for said determination of said relative angle between said selected axis of said first selected wheel and said corresponding axis of said adjacent second selected wheel;

a wheel attachment device for attaching said light beam source to said first selected wheel: and a wheel attachment device for attaching said light beam sensor to a selected wheel of said vehicle.

12. The wheel alignment apparatus for claim 11 wherein said signal processor includes a device for converting said processed signal form an analog domain to a digital domain.

13. The wheel alignment apparatus of claim 11 wherein said position sensitive photosensor is positioned proximate said adjacent second selected wheel of said vehicle such as to detect at least a portion of said beam emitted from said light beam source and modulated at said selected frequency.

14. The wheel alignment apparatus of claim 11 wherein said light beam sensor further includes a light beam reflector positioned proximate said adjacent second selected wheel of said vehicle for reflecting at least a portion of said light beam emitted from said light beam source in a direction substantially toward said position sensitive photosensor, said position sensitive photosensor being positioned proximate said first selected wheel of said vehicle such as to detect at least a portion of sadi light beam reflected from said light beam reflector, said light beam being modulated at sadi selected frequency.

15. The wheel alignment apparatus of claim 11 wherein said magnitude of one of said signals generated by said light beam sensor and detected at said first and second ends of said light beam sensor is zero.

16. The wheel alignment apparatus of claim 11 further comprising a light beam limiting device for limiting a width of said light beam detected by said light beam sensor such that substantially all of said light beam passing through said light beam limiting device is detected by said light beam sensor.

17. A wheel alignment apparatus for measuring selected angles between adjacent wheels of a vehicle, said wheel alignment apparatus comprising:

a plurality of light beam sources for emitting a plurality of light beams, each of said light beams emitted from a position proximate a first selected wheel of said vehicle toward an adjacent second selected wheel, said light beam source comprising at least one light emitting diode for emitting a light beam modulated at a selected frequency, said modulated light beam being directed in a substantially horizontal plane and in a direction substantially parallel to a selected axis of said first selected wheel, one of said plurality of light beam sources being located proximate each of said wheels attached to a primary steering axle directed toward adjacent wheels attached to a secondary steering axle, one each located proximate each of said wheels attached to said secondary steering axle directed toward adjacent said wheels attached to said primary steering axle, and one each located proximate each of said wheels attached to said primary steering axle directed toward adjacent said wheels attached to said primary steering axle;

a plurality of light beam sensors for detecting said light beam modulated at said selected frequency, each of said plurality light beam sensors generating at least two signals, one of said signals being detected at each of first and second ends of each of said plurality of light beam sensors, a magnitude of each of said signals being used to determine a relative angle between a selected axis of said first selected wheel and a corresponding axis of said adjacent second selected wheel, said light beam sensor including a position sensitive photosensor defining an active area positioned to receive said light beam, said active area being continuous between said first and second ends of said light beam sensor, each of said plurality of light beam sensors being positioned to detect said light beam emitted from one said light beam sources;

a signal processor for processing and analyzing said generated signals for said determination of said relative angle between said selected axis of said first selected wheel and said corresponding axis of said adjacent second selected wheel;

a wheel attachment device for attaching said light beam source to said first selected wheel; and a wheel attachment device for attaching said light beam sensor to a selected wheel of said vehicle.

18. The wheel alignment apparatus of claim 17 wherein said signal processor includes a device for converting said processed signal form an analog domain to a digital domain.

19. The wheel alignment apparatus of claim 17 wherein said position sensitive photosensor is positioned proximate said adjacent second selected wheel of said vehicle such as to detect at least a portion of said light beam emitted from said light beam sources and modulated at said selected frequency.

20. The wheel alignment apparatus of claim 17 wherein said light beam sensor further includes a light beam reflector positioned proximate said adjacent second selected wheel of said vehicle for reflecting at least a portion of said light beam emitted from said light beam source in a direction substantially toward said position sensitive photosensor, said position sensitive photosensor being positioned proximate said first selected wheel of said vehicle such as to detect at least a portion of said light beam reflected from said light beam reflector, sadi light beam being modulated at said selected frequency.

21. The wheel alignment apparatus of claim 17 wherein said magnitude of one of said signals generated by said light beam sensor and detected at said first and second ends of said light beam sensor is zero.

22. The wheel alignment apparatus of claim 1 further comprising a light beam limiting device for limiting a width of said light beam detected by said light beam sensor such that substantially all of said light beam passing through said light beam limiting device is detected by said light beam sensor.

* * * * *